United States Patent [19]
Ohki et al.

[11] Patent Number: 5,124,274
[45] Date of Patent: Jun. 23, 1992

[54] METHOD FOR PRODUCTION OF DIELECTRIC-SEPARATION SUBSTRATE

[75] Inventors: Konomu Ohki; Yutaka Ohta; Masatake Katayama, all of Gunma, Japan

[73] Assignee: Shin-Etsu Handotai Co., Ltd., Tokyo, Japan

[21] Appl. No.: 791,518

[22] Filed: Nov. 14, 1991

[30] Foreign Application Priority Data

Nov. 15, 1990 [JP] Japan ................. 2-310201

[51] Int. Cl.$^5$ ........................... H01L 21/304
[52] U.S. Cl. ........................ 437/61; 437/67; 437/68; 437/62
[58] Field of Search ............... 437/62, 63, 67, 68, 437/72, 61

[56] References Cited
U.S. PATENT DOCUMENTS

| | | | |
|---|---|---|---|
| 3,969,168 | 7/1976 | Kuhn | 437/68 |
| 4,233,091 | 11/1980 | Kawabe | 437/68 |
| 4,255,207 | 3/1981 | Nicolay et al. | 437/68 |
| 4,269,636 | 5/1981 | Rivoli et al. | 437/68 |

Primary Examiner—Brian E. Hearn
Assistant Examiner—Trung Dang

[57] ABSTRACT

After the separating grooves has been formed, the polycrystalline silicon deposited as bonded to the single crystal substrate as a supporting base, and the polycrystalline silicon layer ground and polished until the oxide film in the area other than the separating grooves is exposed, the present invention etches the polycrystalline silicon layer on the separating grooves with mixed acid composed of hydrofluoric acid and nitric acid until its thickness equals that of the separating oxide film and subsequently removes the oxide film in the area other than the separating grooves with hydrofluoric acid, As a result, the otherwise inevitable occurrence of projections of polycrystalline silicon can be precluded. When the dielectric-separation substrate obtained by the present invention is used in manufacturing a semiconductor device, therefore, the occurrence of particles due to the chipping of the projections of polycrystalline silicon and the breakage of distributed wires in the produced device can be prevented.

2 Claims, 4 Drawing Sheets

METHOD FOR PRODUCTION OF DIELECTRIC-SEPARATION SUBSTRATE

BACKGROUND OF THE INVENTION

1. Field of the Invention

This invention relates to improvements in and concerning a method for the production of a dielectric-separation substrate for use in a semiconductor integrated circuit having single crystal silicon for the substrate.

2. Description of the Prior Art

Generally, semiconductor integrated circuits are each composed of transistors, diodes, resistors, etc. formed in a limited area of a substrate and, therefore, are required to have some transistors, diodes, resistors, etc. devices electrically insulated and separated from the others. As methods for the separation of such devices, the PN junction separation and the dielectric separation are available, for example. The dielectric separation is advantageous over the PN junction separation because of a high dielectric strength and a small parasitic capacitance. The dielectric separation has been attracting attention in its practical use because this method allows production of a semiconductor integrated circuit enjoying high voltage breakdown, a large capacity, and a high operating speed.

The dielectric separation falls into two forms, one giving rise to a polycrystalline silicon deposition type dielectric-separation substrate and the other a bonded type dielectric-separation substrate. The polycrystalline silicon deposition type dielectric-separation substrate has the disadvantage that the deposition of polycrystalline silicon consumes much time and incurs a heavy cost because this deposition must be continued until the deposited polycrystalline silicon reaches a film thickness of about 500 $\mu$m and, during the deposition, the substrate is warped in consequence of shrinkage of the deposited polycrystalline. In contrast, the bonded type dielectric-separation substrate is free from the disadvantage just mentioned and is highly useful in that it is manufacturable wit a substrate of a large diameter.

The conventional bonded type dielectric-separation substrate has been produced by a method which comprises bonding to a single crystal silicon substrate having an oxide film formed in advance thereon another single crystal silicon substrate through the medium of the oxide film, then grinding and polishing the single crystal silicon substrate and forming a separating groove therein by mesa etching, forming a separating oxide film, depositing thereon a polycrystalline silicon layer of a thickness greater than the depth of the groove thereby completely filling the groove, subsequently polishing the excess polycrystalline silicon layer until the oxide film in the area other than the separating groove is exposed, and thereafter removing the exposed oxide film by etching with hydrofluoric acid.

In the method described above, when the exposed oxide film is removed with hydrofluoric acid, however, the polycrystalline silicon layer 10 assumes the construction of hornlike projections and gives rise to stepped levels as illustrated in FIG. 2.

When the dielectric-separation substrate obtained as described above is used in manufacturing a semiconductor device, the projections are chipped off to give rise to particles in the process of manufacture and the projections have the possibility of inducing discontinuity or breakage of distributed wires after formation of the device.

This invention is aimed at solving the problem described above. An object of this invention is to provide a method for the production of a dielectric-separation substrate having no projection from the polycrystalline silicon layer.

SUMMARY OF THE INVENTION

The object described above is accomplished by a method for the production of a bonded type dielectric-separation substrate having single crystal silicon for the substrate, which method is characterized by comprising a step of forming an oxide film on at least one main surface of a first single crystal silicon substrate, a step of bonding the first single crystal silicon substrate to a second single crystal silicon substrate through the medium of the oxide film after the structure of a sandwich, a step of grinding and polishing the first single crystal silicon substrate to a prescribed thickness, a step of forming in the polished surface of the first single crystal silicon substrate separating grooves reaching the oxide film, a step of forming an oxide film on the entire surface of the substrate inclusive of the inner wall of the separating groove, a step of forming a polycrystalline silicon layer on the separating oxide film, a step of grinding and polishing the polycrystalline silicon layer until the oxide film in the area other than the separating grooves is exposed, a step of etching the polycrystalline silicon in the separating grooves with a mixture of hydrofluoric acid and nitric acid, and a step of removing the oxide film in the area other than the separating groove with hydrofluoric acid.

The other objects and characteristic features of the present invention will become apparent from the following detailed description.

DETAILED DESCRIPTION OF THE INVENTION

After the separating grooves has been formed, the polycrystalline silicon deposited as bonded to the single crystal substrate as a supporting base, and the polycrystalline silicon layer ground and polished until the oxide film in the area other than the separating grooves is exposed, the present invention etches the polycrystalline silicon layer on the separating grooves with a mixture of hydrofluoric acid and nitric acid until its thickness equals that of the separating oxide film and subsequently removes the oxide film in the area other than the separating grooves with hydrofluoric acid. As a result, the otherwise inevitable occurrence of projections of polycrystalline silicon can be precluded. When the dielectric-separation substrate obtained by the present invention is used in manufacturing a semiconductor device, therefore, the occurrence of particles due to the chipping of the projections of polycrystalline silicon and the breakage of distributed wires in the produced device can be prevented.

Now, the present invention will be described more specifically below with reference to a working example.

EXAMPLE

The process for the production of the dielectric-separation substrate according with the present invention is illustrated in FIG. 1a to FIG. 1k.

Figure 1A:
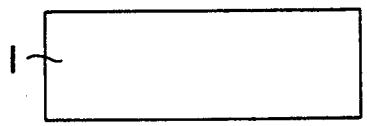
FIG. 1 is a cross section illustrating a process for the production of a dielectric-separation substrate according with the present invention.
Figure 1B:
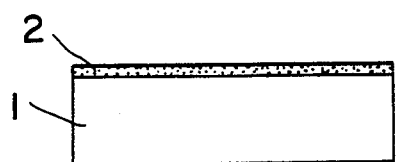

First, a specularly polished N type single crystal silicon substrate 1 having a thickness of 525 μm, a diameter of 100 mm, and plane orientation of (100) is prepared as illustrated in FIG. 1a. In the single crystal silicon substrate 1, n+ layers 2 are formed by diffusion of Sb [FIG. 1b].

Figure 1C:
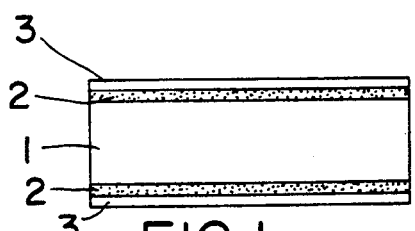

Then, oxide films 3 about 2 μm in thickness are formed by thermal oxidation [FIG. 1c].

Figure 1D:
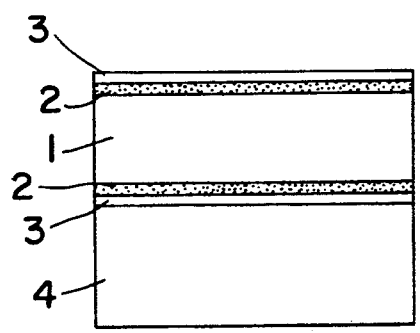
Figure 1E:
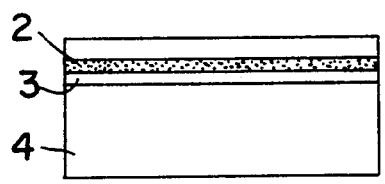

To the substrate, a specularly polished N type single crystal silicon substrate 4 having a thickness of 525 μm and a plane orientation of (100) is attached fast through the medium of one of the oxide films and bonded tightly by being heat-treated at a temperature of not lower than 200° C. [FIG. 1d]. Subsequently, the single crystal silicon substrate 1 is ground and polished to thickness of 30 μm [FIG. 1e].

Figure 1F:
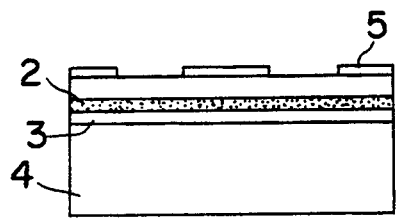

Then, a photolithographic oxide film 5 having a thickness of about 0.6 μm is formed as a masking material and parts of the oxide film 5 are opened by the PEP treatment using a glass mask [FIG. 1f].

Figure 1G:
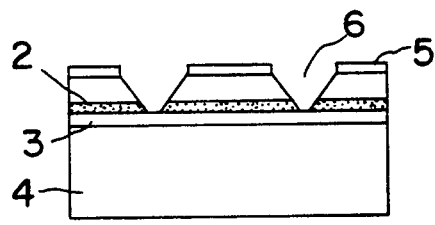

Now, separating grooves 6 measuring 48 μm in width and 30μm in depth are formed by means of anisotropic etching performed at 80° C. by the use of an alkaline etching liquid having KOH as a main component [FIG. 1g].

Figure 1H:
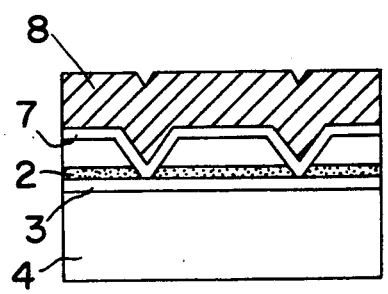
Figure 1I:
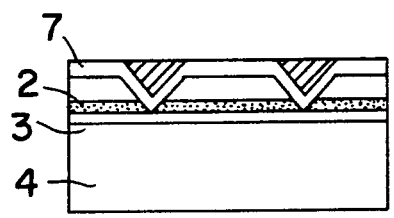

Then, an oxide film 7 is formed by thermal oxidation and a polycrystalline silicon layer 8 is superposed thereon by deposition of polycrystalline silicon at 1150° C. [FIG. 1h]. The polycrystalline silicon layer 8 is ground and polished until the oxide film 7 in the area other than the separating grooves is exposed [FIG. 1i]. Then, with the exposed oxide film as a mask, the polycrystalline silicon layer 8 is slightly etched with an etching liquid [FIG. 1j]. This etching is intended to preclude the phenomenon that in the next step of removing the exposed oxide film 7 and completing single crystal islands, the polycrystalline silicon layer 8 assumes a construction of hornlike projections and gives rise to stepped levels and the chipping of the polycrystalline silicon layer 8 induces occurrence of particles and breakage of distributed wires in the produced device as described above. For this purpose, the polycrystalline silicon layer 8 is only slightly etched in advance of the removal of the exposed oxide film 7.

As the etching liquid in the present invention, a mixed acid is used and the mixed acid containing an organic acid is used particularly desirably. This etching liquid is capable of selectively etching only the polycrystalline silicon layer 8 and sparingly dissolving the exposed film 7. The organic acid contained in the etching liquid moderates the etching action and improves the selectivity of etching. The mixed acid is a mixture consisting of hydrofluoric acid (50% by weight) and nitric acid (60% by weight) in a suitable volumetric ratio in the range of from 1:10 to 1:100.

The organic acids which are effectively usable for incorporation in the mixed acid include acetic acid, propionic acid, and butyric acid, for example. Suitably, the amount of the organic acid to be contained is in the range of from 0 to 2, based on the amount of the mixed acid taken as 1. The thickness of etching (stock for etching) from the polycrystalline silicon layer 8 is desired to be the same as the thickness of the separating oxide film. If the thickness of etching is less than the thickness of the separating oxide film, the occurrence of projections of the polycrystalline silicon layer inconsequence of the removal of the oxide film cannot be precluded. If the thickness of etching exceeds the thickness of the separating oxide film, the removal of the oxide film results in occurrence of large indentations in the polycrystalline silicon layer.

When an etching liquid prepared by mixing 1 part by volume of hydrofluoric acid of a concentration of 50% by weight and 30 parts by volume of nitric acid of a concentration of 61% by weight was used in etching a polycrystalline silicon layer by two minutes' immersion therein, the thicknesses of etching from the polycrystalline silicon layer and the oxide film were respectively 1.8 μm and 0.03 μm.

Figure 1J:
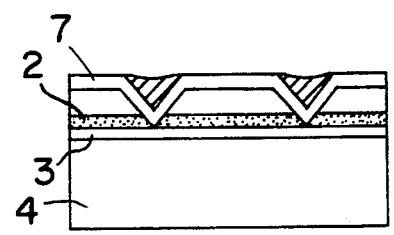
Figure 1K:
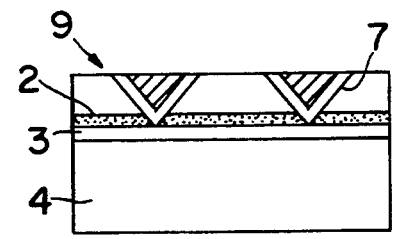
Figure 2:
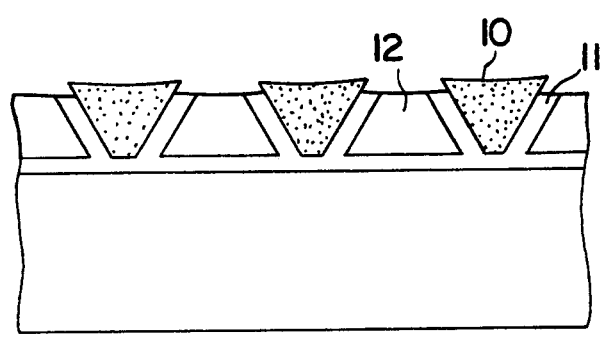
FIG. 2 is a cross section illustrating projections of polycrystalline silicon suffered to occur in the conventional method of production.

Finally, the oxide film 7 is removed with hydrofluoric acid to complete a dielectric-separation substrate 9 [FIG. 1j]. Since the hydrofluoric acid is capable of etching only the oxide film and incapable of etching the polycrystalline silicon, the surface of the produced dielectric-separation substrate 9 shows no prominence of the polycrystalline silicon but possesses gently sloped depressions. Thus, the single crystal silicon and the polycrystalline silicon are completely separated from each other in the dielectric-separation substrate 9.

When the diameters of the single crystal substrates 1 and 4 are varied in the range of from 125 to 150 mm and the thicknesses thereof in the range of from 625 to 700 μm, there are produced dielectric-separation substrates which are free from polycrystalline silicon projection similarly to the product obtained in the working example.

As is clear from the description given above, the method of the present invention produces a dielectric-separation substrate which showes polycrystalline silicon projection and depression only sparing. The use of this dielectric-separation substrate, therefore, permits production of a semiconductor device which suffers neither occurrence of particles by chipping of the polycrystalline silicon nor breakage of distributed wires and consequently enjoys ideal performance.

What is claimed is:

1. A method for the production of a bonded type dielectric-separation substrate having single crystal silicon for the substrate, which method is characterized by comprising a step of forming an oxide film on at least one main surface of a first single crystal silicon substrate, a step of bonding said first single crystal silicon substrate to a second single crystal silicon substrate through the medium of said oxide film after the structure of a sandwich, a step of grinding and polishing said first single crystal silicon substrate to a prescribed thickness, a step of forming in the polished surface of said first single crystal silicon substrate separating grooves reaching said oxide film, a step of forming an oxide film on the entire surface of said substrate inclusive of the inner wall of said separating grooves, a step of forming a polycrystalline silicon layer on said separating oxide film, a step of grinding and polishing said polycrystalline silicon layer until said oxide film in the area other than said separating groove is exposed, a step of etching said polycrystalline silicon in said separating groove with mixed acid composed of hydrofluoric acid and nitric acid, and a step of removing said oxide film in the area other than said separating grooves with hydrofluoric acid.

2. A method according to claim 1, wherein a mixed solution produced by preparing a mixed acid consisting of hydrofluoric acid (50% by weight) and nitric acid (61% by weight) in a volumetric ratio in the range of from 1:10 to 1:100 and blending 1 part by volume of said mixed acid with 0 to 2 parts by volume of one member or a mixture of two or more members selected from the group consisting of acetic acid, propionic acid, and butyric acid is used as the etching liquid.

* * * * *